United States Patent [19]
Watanabe

[11] Patent Number: 6,147,490
[45] Date of Patent: Nov. 14, 2000

[54] MAGNETIC RESONANCE APPARATUS FOR GENERATING POLARIZATION TRANSFER

[75] Inventor: Hidehiro Watanabe, Yokohama, Japan

[73] Assignee: Technology Research Association of Medical and Welfare Apparatus, Tokyo, Japan

[21] Appl. No.: 09/154,029

[22] Filed: Sep. 16, 1998

[30] Foreign Application Priority Data

Sep. 16, 1997 [JP] Japan .................................. 9-250851

[51] Int. Cl.$^7$ ....................................................... G10V 3/00
[52] U.S. Cl. ........................................... 324/307; 324/309
[58] Field of Search ..................................... 324/307, 309

[56] References Cited

U.S. PATENT DOCUMENTS

| 5,019,784 | 5/1991 | Garwood et al. | 324/307 |
| 5,677,628 | 10/1997 | Watanabe et al. | 324/309 |
| 5,894,221 | 4/1999 | Watanabe et al. | 324/307 |
| 6,005,390 | 12/1999 | Watanabe et al. | 324/307 |
| 6,046,588 | 4/2000 | Watanabe | 324/307 |

OTHER PUBLICATIONS

G. A. Morris, et al., Journal of the American Chemical Society, vol. 101, pp. 760 to762, "Enhancement of Nuclear Magnetic Resonance Signals By Polarization Transfer", Jan. 31, 1979.

Geoffrey Bodenhausen, et al., Chemical Physics Letter, vol. 69, No. 1 pp. 185 to 189, "Natural Abundance Nitrogen–15 NMR By Enhanced Heteronuclear Spectroscopy", Jan. 1, 1980.

H. Watanabe, et al., Proceeding of the Society of Magnetic Resonance, 3$^{rd}$ Annual Meeting, p. 1935, "3–D Localized $^{13}$C Spectroscopy By Modified Inept And Dept", 1995.

H. Watanabe, et al., Proceeding of the International Society for Magnetic Resonance in Medicine, 4$^{th}$ Annual Meeting, p. 1220, "Spatially 3D–Localized HSQC By Using Modified Inept", 1996.

H. Watanabe, et al., Proceeding of the International Society for Magnetic Resonance in Medicine, 5$^{th}$ Annual Meeting, p. 1436, "Multivoxel $^1$H–$^{13}$C HSQC Spectroscopy Using Multislice Techniques With a 2IzSz State", 1997.

*Primary Examiner*—Christine K. Oda
*Assistant Examiner*—Tiffany A. Fetzner
*Attorney, Agent, or Firm*—Oblon, Spivak, McClelland, Maier & Neustadt, P.C.

[57] ABSTRACT

A magnetic resonance apparatus wherein an excitation pulse and refocusing pulse are applied to the spins of $1_H$ and a return pulse is applied at an echo time. A plurality of inversion pulses having different frequency bands from each other are applied, at an interval between the excitation pulse to the spins of $1_H$ and the return pulse, to the spins of $13_C$ spin-spin coupled to $1_H$. By doing so, a polarization transfer occurs from the spins of the $1_H$ to the spines of the $13_C$. And an excitation pulse is applied to the spins of the $13_C$ simultaneously with or after the return pulse to the spins of the $1_H$. By doing so, magnetic resonance signal of the $13_C$ is enhanced through the polarization transfer. There are sometimes the cases where, through the returning of the polarization from the $13_C$ to the $1_H$, it is possible to receive the information on the spins of $13_C$ from the spins of the $1_H$. In either case, as set out above, a plurality of inversion pulses are applied and, by doing so, their frequency bands are made different and it is thus possible to properly invert the spins of the $13_c$ in various compounds.

19 Claims, 11 Drawing Sheets

MAGNETIC RESONANCE APPARATUS FOR GENERATING POLARIZATION TRANSFER

BACKGROUND OF THE INVENTION

The present invention relates to a magnetic resonance apparatus for acquiring information on the spins of a low sensitive nuclide of $^{13}C$, etc., for MRS (Magnetic Resonance Spectroscopy) after being enhanced through the utilization of a spin-spin coupling to $^1H$.

The main function of an MRI (Magnetic Research Imaging) is to noninvasively image the $H_2O$ distribution in a living body of a human subject. This $H_2O$ distribution provides the morphological information.

In contrast, the MRS is to detect $^1H$, $^{13}C$ or $^{31}C$ and investigate the metabolic function in a living body. Attention has now been paid to $^{13}C$ -MRS. Since the $^{13}C$ in nature reveals an abundance ratio of as low as 1.1% it can be used as a tracer.

For the conventional $^{13}C$ -MRS, however, a problem arises from the low S/N. In order to overcome this problem, a method has been proposed which utilizes the polarization of $^1H$. The method is classified into a $^{13}C$ observation method for transferring the polarization of $^1H$ to $^{13}C$ and observing a signal from the $^{13}C$ and an $^1H$ observation method for, after transferring the polarization of $^1H$ to $^{13}C$, returning the polarization back to the $^1H$ and observing a signal from the $^1H$.

Figure 1:
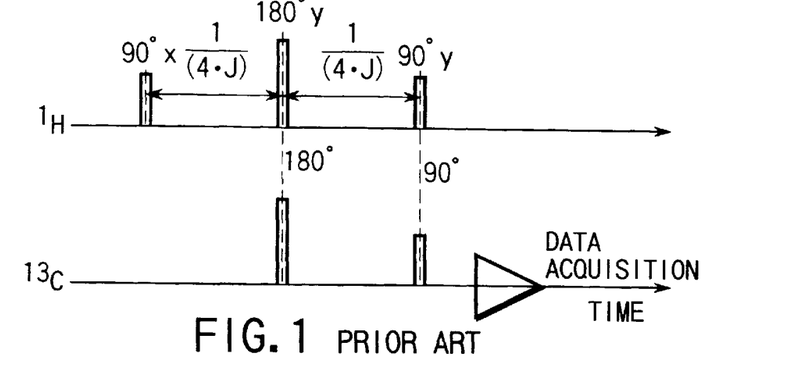
FIG. 1 is a view showing a conventional INEPT sequence.

As the $^{13}C$ observation method, an INEPT (Insensitive Neclei Enhanced by Polarization Transfer) has been announced in G. A. Morris and et al "J. Am. Chem. Soc., Vol. 101, p.760, 1979. FIG. 1 shows an RF pulse sequence of the INEPT.

Figure 2:
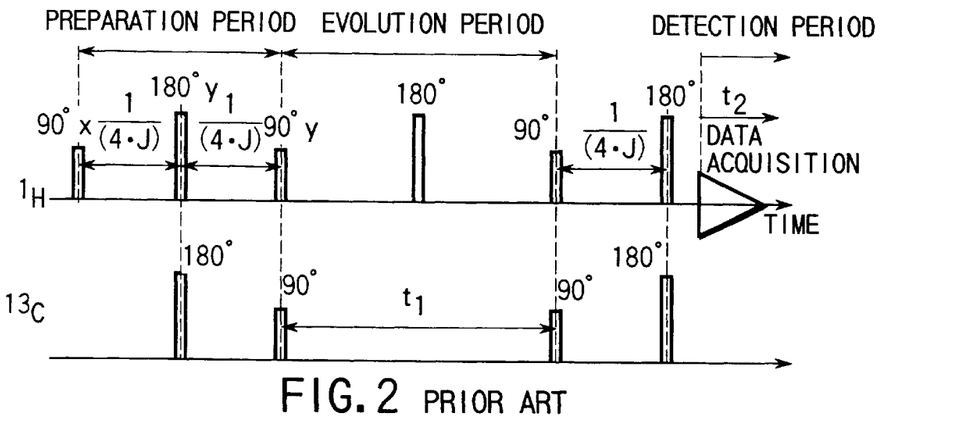
FIG. 2 is a view showing a conventional HSQC sequence.

As the $^1H$ observation method, an HSQC (Heteronuclear Single Quantum Coherence) has been announced in G. Bodenhausen "Chem. Phys. Letters, Vol. 69, p.189, 1980". FIG. 2 shows an RF pulse sequence of the HSQC. The RF pulse of the HSQC is so designed as to return, back to $^1H$ side, the polarization which has been transferred from $^1H$ to $^{13}C$ by INEPT.

A RF pulse for bringing to a transverse magnetization, the spins of a nuclide of interest is referred to as an excitation pulse, an RF pulse for refocusing the spins of a nuclide of interest is referred to as a refocusing pulse, and an RF pulse for inverting the spins of a nuclide of interest is referred to as an inversion pulse and an RF pulse for returning a transverse magnetization to a longitudinal magnetization is referred to as a return pulse. The excitation pulse is constituted by an RF pulse having such a function as to allow a transverse magnetic component to be generated at the spins of the nuclide of interest. The spins to which the excitation pulse is applied flip, for example, at 90° about an x- or y-axis. The spins to which the refocusing pulse is applied are rotated, for example, 180° about an x- or y-axis. The inversion pulse is constituted by an RF pulse having a function to invert the polarities of the spins in a longitudinally magnetized position. The spins to which the inversion pulse is applied are rotated, for example, about the x- or y-axis.

In the INEPT, the excitation pulse is applied to $^1H$. After 1/(4·J) from the application of the excitation pulse a refocusing pulse is applied to the $^1H$ and, simultaneously with the refocusing pulse, an inversion pulse is applied to $^{13}C$ and, by doing so, a coherence state "2IxSz" is generated at an echo time, where I corresponds to the spins of $^1H$ and S corresponds to the spins of $^{13}C$.

Further, at the echo time, the return pulse is applied to the $^1H$. In this way, a state "2IzSz" is generated. Simultaneously with this excitation pulse, the excitation pulse is applied to $^{13}C$ and a coherence state "2IzSx" is set. The coherence "2IzSx" represents the spins of $^1H$ in the longitudinal magnetization position not producing any signal and the spins of $^{13}C$ in the transverse magnetization producing a signal. By doing so, a signal enhanced by the polarization transfer can be detected from the $^{13}C$.

The magnitude of the signal can be given by 2IxSz·cosθ, provided that the actual flip angle of $^{13}C$ produced by the inversion pulse is given as θ. That is, achieving the spins of $^{13}C$ accurately at 180° through the application of the inversion pulse to $^{13}C$ is important to obtain a high S/N ratio.

For the NMR spectrometer, because of the sample size being small it is possible to reduce the radius of a probe (RF coil) and, without the need to apply too much power to the probe, the spins of $^{13}C$ are effectively inverted through the application of the inversion pulse. Even if, therefore, the width of the inversion pulse is of the order of a few tens of microseconds, the spins of $^{13}C$ are inverted with neither an excess nor a shortage.

For the in-vivo case of a human being in particular, the probe size becomes greater and, in order to invert the spins of the $^{13}C$, a larger power is necessary. Since, however, a restriction is placed on the withstand voltage of a capacitor of the probe, it is not possible to apply too much power to the probe for a shorter period of time. In order to accurately invert the spins of $^{13}C$, it is necessary to lengthen the pulse width of the inversion pulse.

Since the longer the pulse width, the narrower the frequency band, the spins of the $^{13}C$ of these $^{13}C$ compounds having a chemical shift of a few KHz cannot all adequately be inverted.

Here it is supposed that an observation is made on the action of the $^{13}C$ by administering, to a living body, the glucose C-1 labeled with the $^{13}C$. The difference between the resonance frequency of the $^{13}C$ in the 1-position of the administered glucose C-1 and that of the $^{13}C$ in an amino acid produced through the metabolic process in the living body is about 70 ppm. The 70 ppm corresponds to 1.5 kHz at 2 teslas. After the width of the inversion pulse for the $^{13}C$ is set, if the center frequency of the inversion pulse is matched to the resonance frequency of the $^{13}C$ in a amino acid C-4, the spins of $^{13}C$ in the glucose α C-1, glucose β C-1 flip only at about 60°, that is, there is hardly no polarization transfer between the spins of $^1H$ and those of $^{13}C$ in the glucose α C-1, glucose β C-1.

BRIEF SUMMARY OF THE INVENTION

It is accordingly the object of the present invention to provide a magnetic resonance apparatus adapted to obtain information on the spins of a low sensitive nuclide, with a high sensitivity, through the utilization of a spin-spin coupling to a high sensitive nuclide, which is characterized in that, by adjusting the narrowing of bands of inversion pulses and the incompleteness of the inversions of the low sensitive nuclide's spins of a broader chemical shift, it is possible to accurately produce a polarization transfer between the spins of the high sensitive nuclide and the spins of the low sensitive nuclide and hence to achieve an improved S/N ratio.

According to the present invention, it is possible to obtain the following advantages. That is, an excitation pulse and refocusing pulse are applied to the spins of a first nuclide and a return pulse is applied at an echo time. A plurality of inversion pulses of different frequency bands are applied, at an interval between the excitation pulse to the spins of the first nuclide and the return pulse, to the spins of a second nuclide spin-spin coupling to the first nuclide. By doing so, a polarization transfer is produced from the spins of the first nuclide to the spins of the second nuclide. The excitation pulse is applied to the spins of the second nuclide simultaneously with, or after, the return pulse to the spins of the first nuclide. By doing so, enhanced polarization transfer signal of the spins of the second nuclide can be obtained. By the polarization transfer from the second nuclide to the first nuclide it is also possible to receive, from the spins of the first nuclide, information on the spins of the second nuclide. Even in any case, as set out above, a plurality of inversion pulses are applied and, by making their frequency bands different from each other, it is possible to properly invert the spins of the second nuclide in various compounds.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments give below, serve to explain the principles of the invention.

DETAILED DESCRIPTION OF THE INVENTION

A preferred embodiment of the present invention will be explained below with reference to the accompanying drawing. In an explanation below, it is assumed that $^1H$ denotes a high sensitive nuclide and $^{13}C$ denotes a low sensitive nuclide. A combination of the $^1H$ and $^{13}C$ are not restricted thereto. For example, it may be possible to use a combination of, for example, $^1H$ and $^{15}N$.

Figure 3:
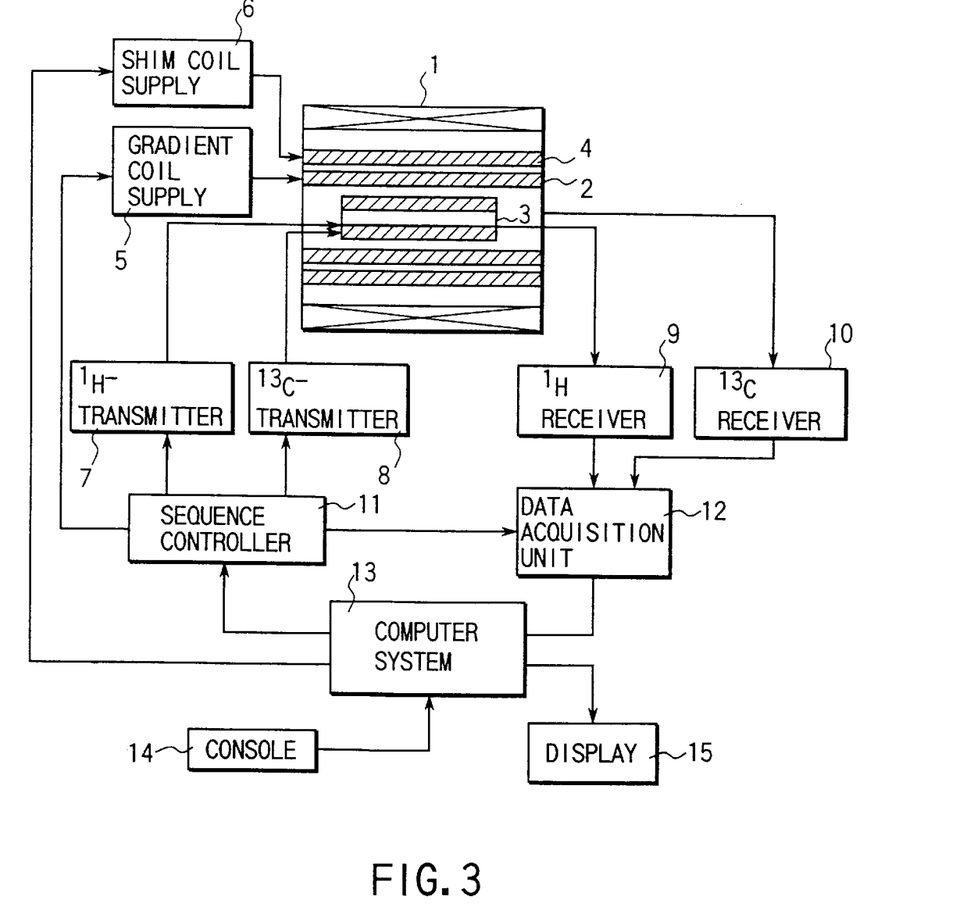
FIG. 3 is a schematic view showing a magnetic resonance apparatus according to a preferred embodiment of the present invention.

FIG. 3 shows an arrangement of a magnetic resonance diagnostic apparatus according to an embodiment of the present invention. A static magnetic field coil 1, shim coil 4, gradient coil 2 and probe (RF coil) 3 are mounted at a gantry. A space is defined in a substantially central area of the gantry to properly accommodate a human subject. The static magnetic field magnet coil 1 generates a static magnetic field in the space. The uniformity of the static magnetic field is enhanced by a local magnetic field generated by the shim coil 4 and shim coil supply 6.

The gradient coil 2 includes an x-coil, y-coil and z-coil. When an electric current is supplied from a gradient coil supply 5 to the x-, y- and z-coils, a gradient magnetic field is generated in the space in a manner to have its magnetic intensity linearly varied along the x-, y- and z-axes.

The probe 3 has a high frequency coil. When a high frequency signal is supplied to the probe 3 from a transmitter 7 for the $^1H$, an RF pulse is applied to the human subject. The spins of the $^1H$ in the human subject is resonant to the RF pulse. When the high frequency signal is supplied to the probe 3 from a $^{13}C$ transmitter 8, an RF pulse is applied to the human subject. The spins of $^{13}C$ in the human subject are resonant to the RF pulse.

A magnetic resonant signal generated from the spins of the $^1H$ is received by a $^1H$ receiver 9 via a probe 3 and acquired by a data acquisition unit 12. A magnetic resonance signal generated from the spins of the $^{13}C$ is received by a $^{13}C$ receiver 10 via the probe 3 and acquired by the data acquisition unit 12. Based on the magnetic resonance signal acquired by the data acquisition unit 12, a computer system 13 reconstructs spectrum data of a desired nuclide in the human subject or image data. The spectrum data or image data is sent to a display 15 where a corresponding spectrum or image, etc., is displayed.

In order to implement a pulse sequence as will be set out below, a sequence controller 11 controls the gradient coil supply 5, $^1H$ transmitter 7, $^{13}C$ transmitter 8, $^1H$ receiver 9, $^{13}C$ receiver 10, etc. Further, the sequence controller 11 is controlled by a computer system 13 for processing an instruction coming from a console 14.

The pulse sequence for the present embodiment will be explained below. The present embodiment can be applied to any of the INEPT sequence and HSQC sequences and can be variously modified. Those terminologies herein used for explanation are defined as follows:

The term "excitation pulse" is intended to mean an RF pulse for exciting the spins of a nuclide of interest to generate a transverse magnetization component, noting that the spins of the nuclide flip, for example at 90°, about an x- or y-axis. The term "refocusing pulse" is intended to mean an RF pulse applied to refocus a transverse magnetization component of spins dispersed, noting that the spins to which the refocusing pulse is applied are, for example at 180°, about an x- or y-axis.

The term "inversion pulse" is intended to mean an RF pulse having the function of inverting the polarities of the spins in a longitudinal magnetization position, noting that the spins to which the inversion pulse is applied are, for example at 180°, about an x- or y-axis.

The term "return pulse" is intended to mean an RF pulse having a function of returning the spins to a longitudinal magnetization position not producing a signal, noting that the spins to which the return pulse is applied are, for example at 90°, about an x- or y-axis.

Figure 4:
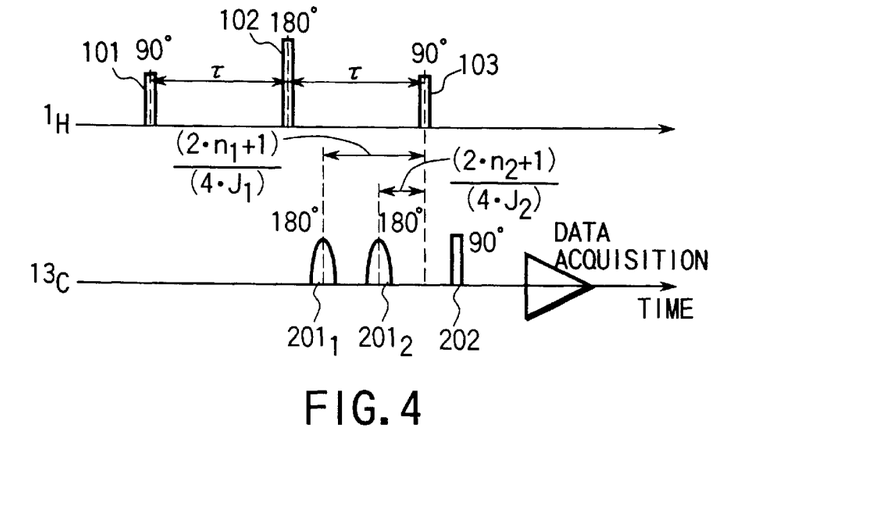
FIG. 4 is a view showing a first INEPT sequence of applying two inversion pulses to $^{13}C$ in accordance with the present invention.

FIG. 4 shows a first modified INEPT sequence for the present embodiment. In the modified INEPT, an excitation pulse 101 is applied to the $^1H$ and, after the application of this excitation pulse, a refocusing pulse 102 is applied to the $^1H$ and, at this echo time, a return pulse is applied to the $^1H$.

In the modified INEPT, in general, with a spin-spin coupling constant between the $^1H$ and the $^{13}C$ given by "J", an inversion pulse is applied to the $^{13}C$ at $1/(4 \cdot J)$ before the echo time, whereby the spins of the $^1H$ magnetically coupled to the $^{13}C$ creates a state "2IxSz" at the echo time. Then an excitation pulse is applied to the $^{13}C$ simultaneously with, or after, the return pulse to the $^1H$, so that a "2IzSx" coherence is created. By doing so, a polarization transfer occurs from the $^1H$ to the $^{13}C$ and a magnetic resonance signal can be received, with a high sensitivity, from the $^{13}C$.

Here, if the width of the inversion pulse to the $^{13}C$ is made adequately long so as to properly invert the spins of $^{13}C$, it follows that the frequency band is narrowed. Further, the width of the chemical shift of the $^{13}C$ is relatively greater and the resonant frequency of the spins of the $^{13}C$ in a given kind of compounds is outside of the narrow band of the inversion pulse, thus failing to properly invert the spins of the $^{13}C$ in the compound. This presents a possibility of corresponding information being not obtained as set out in conjunction with the prior art.

In the present embodiment, this problem is solved by the application of a plurality of inversion pulses $201_1$, $201_2$ of different frequency bands as will be set out in more detail below. For example, a glucose C-1 is labeled with $^{13}C$ is administered to a human being. A glutamate C-2, glutamate C-3 and glutamate C-4 are produced through the metabolic process of a human subject.

For an accurate diagnosis of the metabolic function, it is necessary to observe all these compounds such as glucose C-1, glutamate C-2, glutamate C-3 and glutamate C-4. As set out above, however, the width of the chemical shift of the $^{13}C$ is greater and, between the glucose α C-1, glucose β C-1 and glutamate C-2, their resonance frequency differs by about 30 ppm due to the chemical shift. Further, between glutamate C-2 and glutamate C-4, their resonance frequency is in a broadening range of about 30 ppm. This value (30 ppm) corresponds to about 640 Hz for a magnetic field strength of 2T (teslas).

Figure 5:
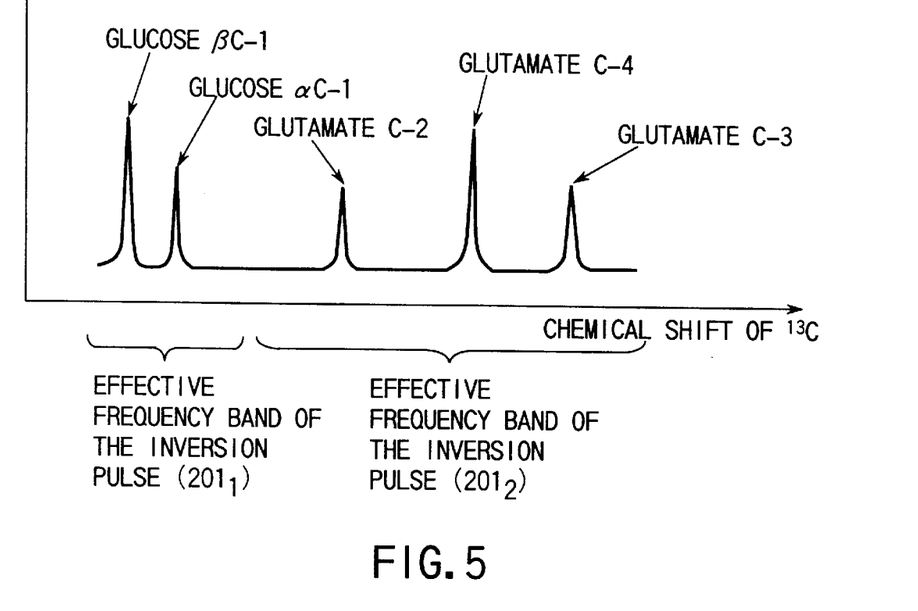
FIG. 5 shows a schematic of 1D $13_C$ spectrum of compounds involving the spins of the $^{13}C$ to which two inversion pulses (FIG. 4) are applied.
Figure 6:
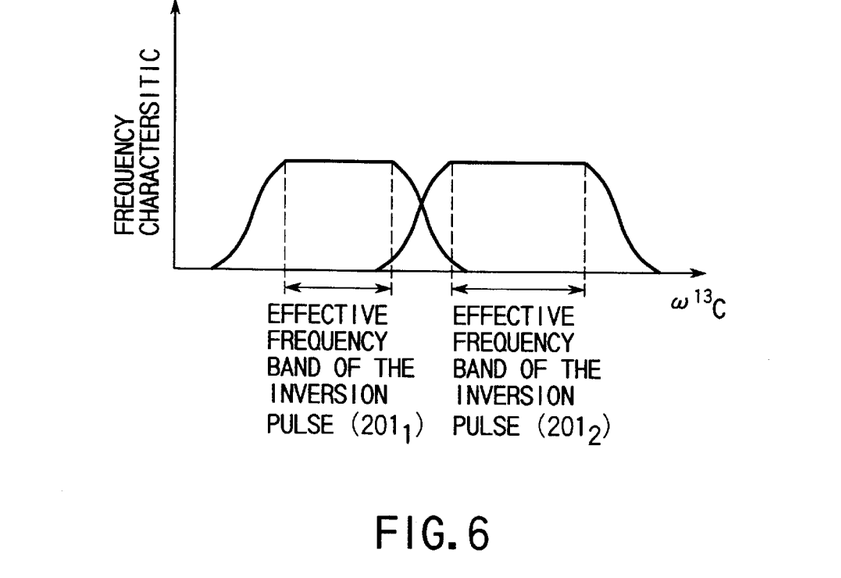
FIG. 6 is a view showing the frequency bands of the two inversion pulses in FIG. 4.

In the present embodiment, as shown in FIG. 5, in order to properly invert the spins of the $^{13}C$ in the glucose α C-1, glucose β C-1 with an inversion pulse $201_1$ and the spins of the $^{13}C$ in glutamate C-2, glutamate C-4 and glutamate C-3 with another inversion pulse $201_2$, two inversion pulses $201_1$ and $201_2$ are used in different frequency band ranges as shown in FIG. 6, that is, the effective frequency bands of the inversion pulse $201_1$ and that of the inversion pulse $201_2$ are separated from each other.

Needless to say, in order to properly invert the spins of the $^{13}C$ in the glucose α C-1, glucose β C-1 and in glutamate C-2 with the inversion pulse $201_1$ and the spins of the $^{13}C$ in glutamate C-4 and glutamate C-3 with another inversion pulse 201, the frequency bands of these two inversion pulses $201_1$, $201_2$ may be adjusted. And in order to properly invert the spins of the $^{13}C$ in the glucose α C-1, glucose β C-1 and in glutamate C-2 and glutamate C-4 with the inversion pulse $201_1$ and the spins of the $^{13}C$ in the glutamate C-3 with another inversion pulse $201_2$, the frequency bands of these two inversion pulse $201_1$, $201_2$ may be adjusted.

An explanation will be given below about the application time of the pulses. The inversion pulse $201_1$ to the $^{13}C$ is applied at $(2 \cdot n_1 + 1)/(4 \cdot J_1)$ before the echo time and, similarly, the inversion pulse $201_2$ to the $^{13}C$ is applied at a time $(2 \cdot n_2 + 1)/(4 \cdot J_2)$ before the echo time. In this connection it is to be noted that the $n_1$ and $n_2$ denote an integer greater than zero. And $n_1 \neq n_2$ at $J_1 = J_2$.

Here, the spins of the $^{13}C$ in the glucose α C-1, glucose β C-1 have only to be inverted for the inversion pulse $201_1$ and "$J_1$" is set to a constant of a spin-spin coupling between the $^1H$ and the $^{13}C$ in the glucose α C-1, glucose β C-1. In this case, when $n_1 = 1$ for example, the inversion pulse $201_1$ is applied at 4.7 ms time before the echo.

Then the spins of $^{13}C$ in glutamate C-2, glutamate C-3 and glutamate C-4 are inverted with the inversion pulse $201_2$ and $J_2$ is set to be equal to 140 Hz ($J_2 = 140$ Hz), taking into consideration that the spin-spin coupling constant between $^1H$ and $^{13}C$ in glutamate C-2 is about 150 Hz and that the spin-spin coupling constant between $^1H$ and $^{13}C$ in glutamate C-3 and glutamate C-4 is about 130 Hz. In order to completely separate the inversion pulses $201_2$ relative to the inversion pulse $201_1$ on a time base, assuming that $n_2 = 0$ for example, the inversion pulse $201_2$ is applied earlier than the echo time by 1.8 ms.

Although, in the above-mentioned case, explanation has been given about the different $J_1$ and $J_2$, if there is a difference in the chemical shift of $^{13}C$, the present method can be used, even under the equal Js', without presenting any problem.

As evident from the above, it is possible to all invert the spins of $^{13}C$ in the glucose α C-1, glucose β C-1 and in glutamate C-2, glutamate C-4 and glutamate C-3. Further, the application order of the inversion pulses $201_1$, $201_2$ can be inverted as shown in FIG. 4.

Figure 7:
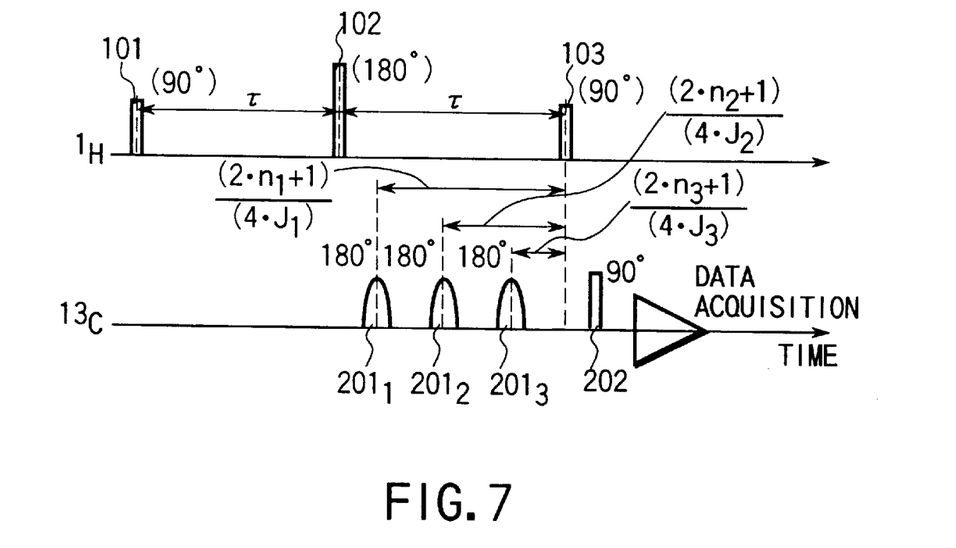
FIG. 7 is a view showing a second modified INEPT sequence for applying three inversion pulses to the $^{13}C$ in the present embodiment.
Figure 8:
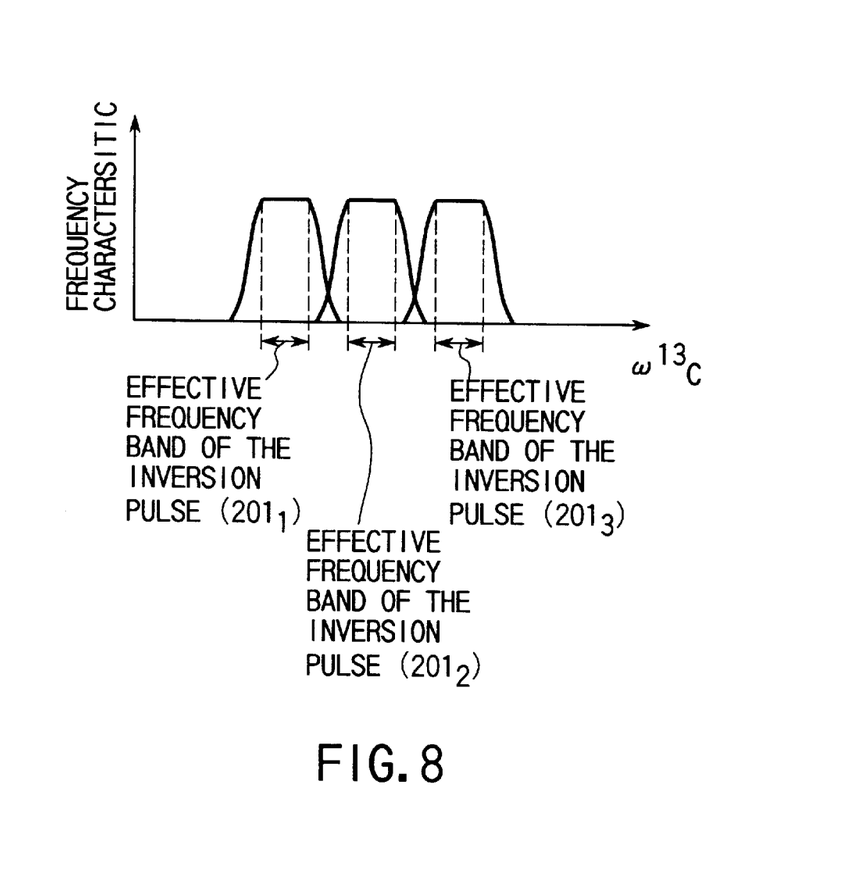
FIG. 8 is a view showing the frequency bands of three inversion pulses in FIG. 7.

As shown in FIGS. 7 and 8, it may be possible to apply three inversion pulses $201_1$, $201_2$, $201_3$ of different frequency bands to the spins of the $^{13}C$. In this case, the frequency bands of the three inversion pulses $201_1$, $201_2$, $201_3$ are so controlled as to invert the spins of the $^{13}C$ of the glucose α C-1, glucose β C-1 and glutamate C-2, or glutamate C-4 and glutamate C-3 by any of the three inversion pulses $201_1$, $201_2$ and $201_3$, or the spins of the $^{13}C$ of the remaining two compounds with the remaining two inversion pulses.

Figure 9:
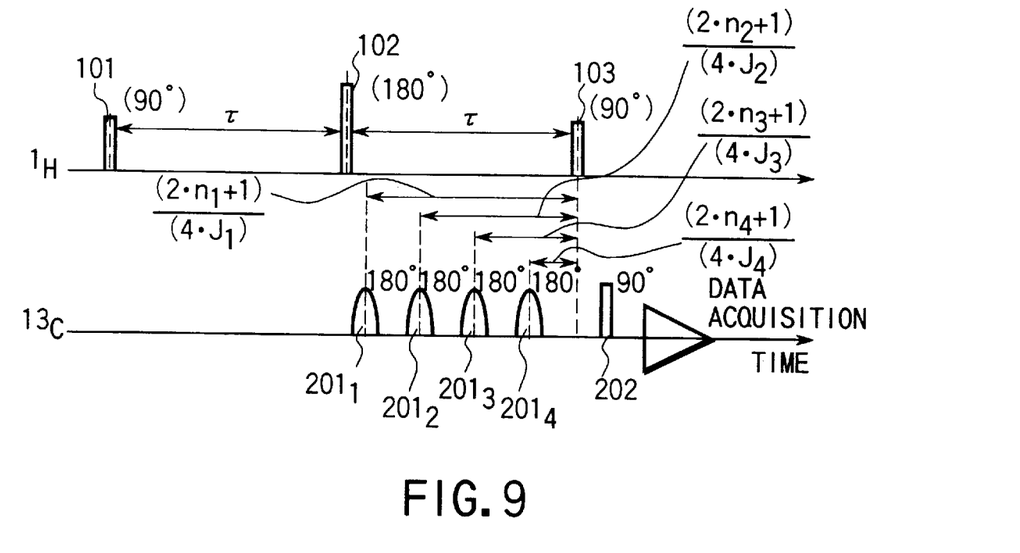
FIG. 9 is a view showing a third modified INEPT sequence of applying four inversion pulses to the $^{13}C$ in the present embodiment.
Figure 10:
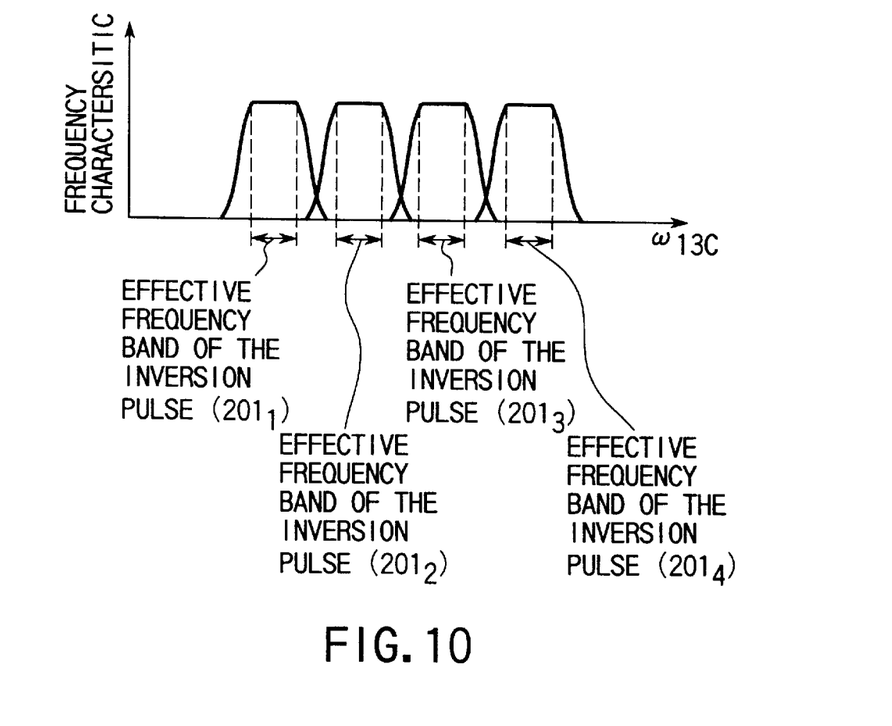
FIG. 10 is a view showing the frequency bands of four inversion pulses in FIG. 9.

As shown in FIGS. 9 and 10, it may be possible to apply four inversion pulses $201_1$, $201_2$, $201_3$ and $201_4$ of different frequency bands to the spins of the $^{13}C$. In this case, the frequency bands of the four inversion pulses $201_1$, $201_2$, $201_3$ and $201_4$ are so controlled as to invert the spins of the $^{13}$C in the glucose α C-1, glucose β C-1 and in glutamate C-2, glutamate C-4 and glutamate C-3 with the four inversion pulses $201_1$, $201_2$, $201_3$ and $201_4$.

Figure 11:
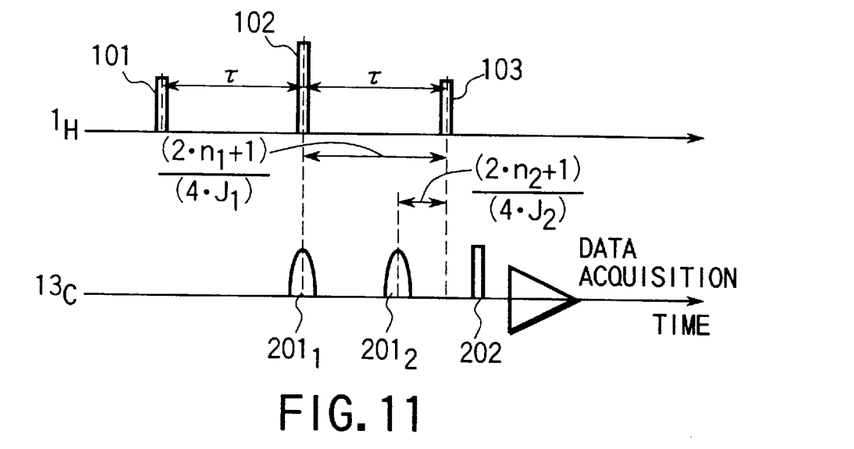
FIG. 11 is a view showing a fourth modified INEPT sequence in the present embodiment.
Figure 12:
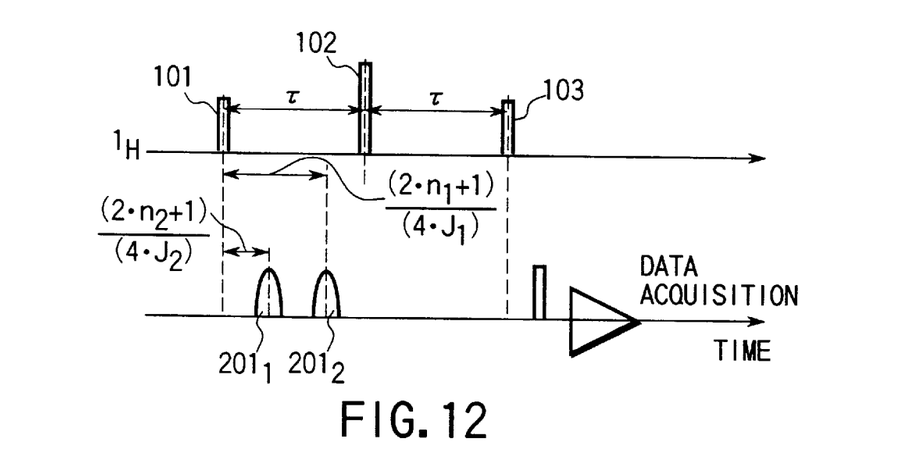
FIG. 12 is a view showing a fifth modified INEPT sequence in the present embodiment.

Further, as shown in FIG. 11, it may be possible to apply one of the two inversion pulses $201_1$, $201_2$ to the $^{13}$C simultaneously with a refocusing pulse 102 to the $^1$H. As shown in FIG. 12, a polarization transfer can be produced even by applying the two inversion pulses $201_1$ and $201_2$ to the $^{13}$C before the refocusing pulse 102 to the $^1$H but at $(2 \cdot n_1 + 1)/(4 \cdot J_1)$ and $(2 \cdot n_2 + 1)/(4 \cdot J_2)$, respectively, after the excitation pulse 101 to the $^1$H.

Figure 13:
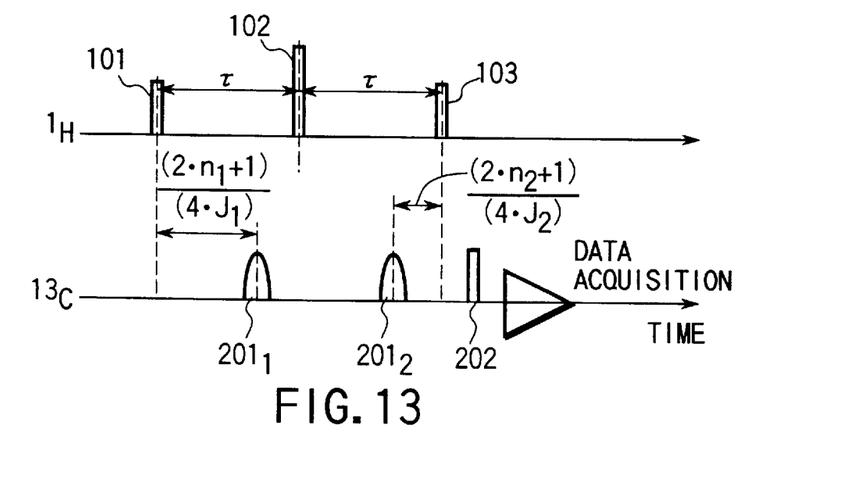
FIG. 13 is a view showing a sixth modified INEPT sequence in the present embodiment.

Further, as shown in FIG. 13, the polarization transfer can be produced even by applying one of two inversion pulses $201_1$ and $201_2$ to the $^{13}$C before the refocusing pulse 102 to the $^1$H but at $(2 \cdot n_1 + 1)/(4 \cdot J_1)$ after the excitation pulse 101 to the $^1$H and the other of these two inversion pulses to $^{13}$C after the refocusing pulse 102 to the $^1$H but at $(2 \cdot n_2 + 1)/(4 \cdot J_2)$ or $(2 \cdot n_1 + 1)/(4 \cdot J_1)$ before the echo time. In this case, it is possible to obtain $n_1 = n_2$ at $J_1 = J_2$.

Figure 14:
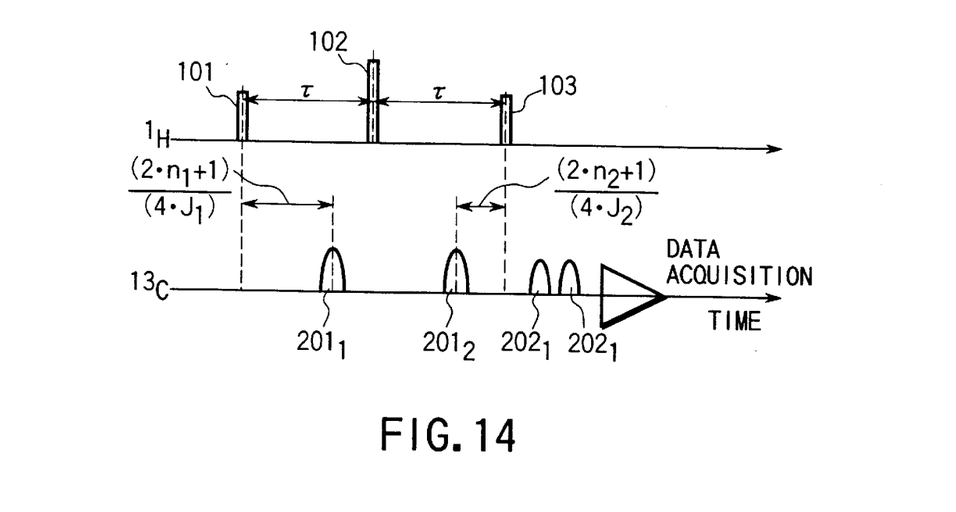
FIG. 14 is a view showing a seventh modified INEPT sequence in the present embodiment.

Further, as shown in FIG. 14, it may be possible to apply two excitation pulses $202_1$ and $202_2$ of different frequency bands to the spins of $^{13}$C. In this case, the frequency bands of the two excitation pulses $202_1$, $202_2$ are so controlled as to excite, for example, the spins of $^{13}$C in the glucose α C-1, glucose β C-1 and in glutamate C-2, glutamate C-3 and glutamate C-4 with the use of the excitation pulse $202_2$. Needless to say, the frequency bands of two excitation pulses $202_1$, $202_2$ may be so controlled as to, for example, excite the spins of $^{13}$C in the glucose α C-1, glucose β C-1 and in glutamate C-2 with the use of the excitation pulse $202_1$ and the spins of the $^{13}$C in the glutamic acid and the spins of the $^{13}$C in glutamate C-3 and glutamate C-4 with the use of the excitation pulse $202_2$. Further, the frequency bands of the two excitation pulses $202_1$, $202_2$ may be so controlled as to, for example, excite the spins of $^{13}$C in the glucose α C-1, glucose β C-1 and in glutamate C-2 and glutamate C-4 with the use of the excitation pulses $202_1$ and the spins of the $^{13}$C in glutamate C-3 with the use of the excitation pulses $202_2$.

Figure 15:
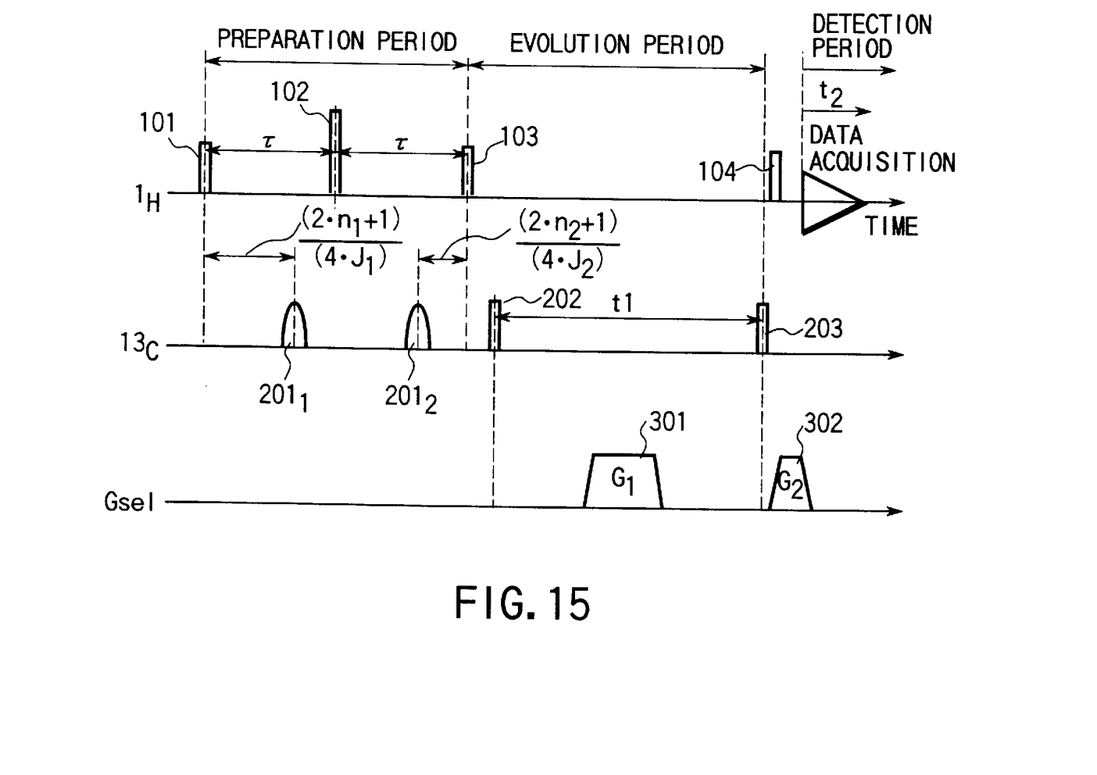
FIG. 15 is a view showing a first modified HSQC sequence in the present embodiment.

Further, the present embodiment can be applied to the HSQC involving the INEPT at the preparation period. One example is shown in FIG. 15. For the HSQC, after the INEPT sequence it follows that, after a $t_1$ period (an evolution period) in which single quantum coherence of $^{13}$C between an excitation pulse 202 to the $^{13}$C and a return pulse 203 to the $^{13}$C is evaluated, the return pulse 203 is applied to the $^{13}$C and, further, an excitation pulse 104 is applied to the $^1$H and a magnetic resonance signal is acquired during a $t_2$ period (a detection period), from the spins of the $^1$H.

In the HSQC it is necessary to suppress a H$_2$O signal and the H$_2$O signal suppression technique may be adopted from any proper methods. For example, by applying a spoiling gradient pulse following the application of a CHESS (chemical shift selective) RF pulse for selectively exciting only $^1$H spins in H$_2$O, the $^1$H spins in the H$_2$O are completely dephased and after almost no signal has emerged from the $^1$H in the H$_2$O it may be possible to start the pulse sequence of the INEPT and HSQC. Further, as shown in FIG. 15, H$_2$O signal can be eliminated by coherence selection using gradient pulses 301 and 302. In this connection it is to be noted that, if G1 and G2 given below satisfy an equation (1) or (2) then it is possible to suppress the H$_2$O signal through the coherence selection.

$$\gamma 2 \cdot G1 + \gamma 1 \cdot G2 = 0 \tag{1}$$

$$\gamma 2 \cdot G1 - \gamma 1 \cdot G2 = 0 \tag{2}$$

where

G1: a time integral of the magnetic field intensity of the gradient pulse 301;

G2: a time integral of the magnetic field intensity of the gradient pulse 302;

γ1: the magnetogyric ratio of $^1$H; and

γ2: the magnetogyric ratio of $^{13}$C.

Figure 16:
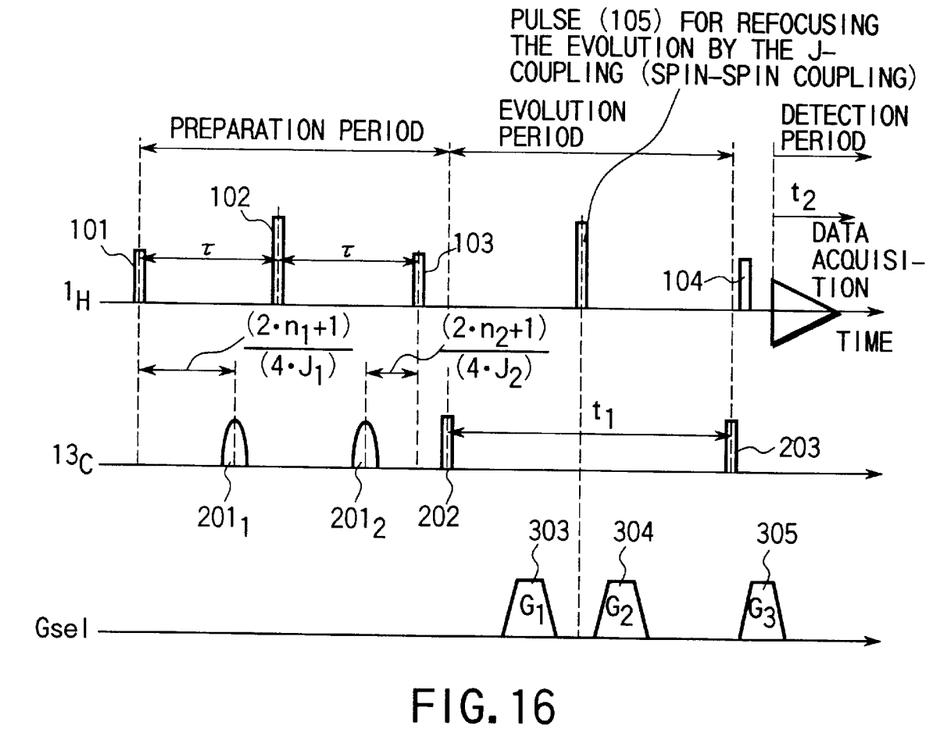
FIG. 16 is a view showing a second modified HSQC sequence in the present embodiment.

As shown in FIG. 16, by applying a refocusing pulse 105 to the $^1$H, or applying a decoupling pulse, in a development time $t_1$, it is possible to refocus the J evolution caused by the spin-spin coupling between the first nuclide and the second nuclide. Gradient pulses 303, 304, 305 for coherence selection have only to be so applied as to have their time integrals satisfy the following equations (3) or (4):

$$\gamma 2 \cdot G1 + \gamma 2 \cdot G2 + \gamma 1 \cdot G3 = 0 \tag{3}$$

$$\gamma 2 \cdot G1 + \gamma 2 \cdot G2 - \gamma 1 \cdot G3 = 0 \tag{4}$$

Figure 17:
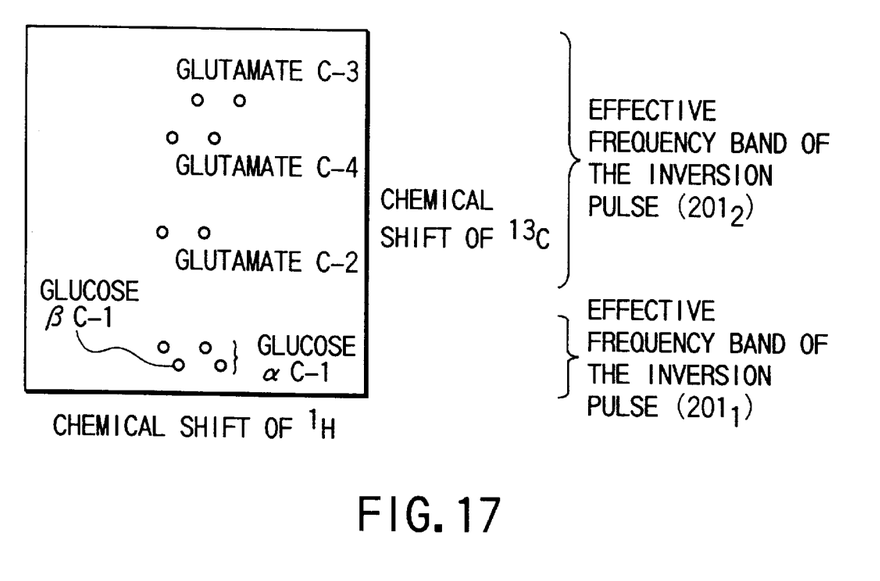
FIG. 17 is a schematic 2-dimensional correlation spectrum of compounds involving the spins of the $^{13}C$ to which two inversion pulses (FIG. 4) are applied.

Using the sequence shown in FIG. 16, 2D correlation HSQC spectrum (FIG. 17) can be obtained.

Figure 18:
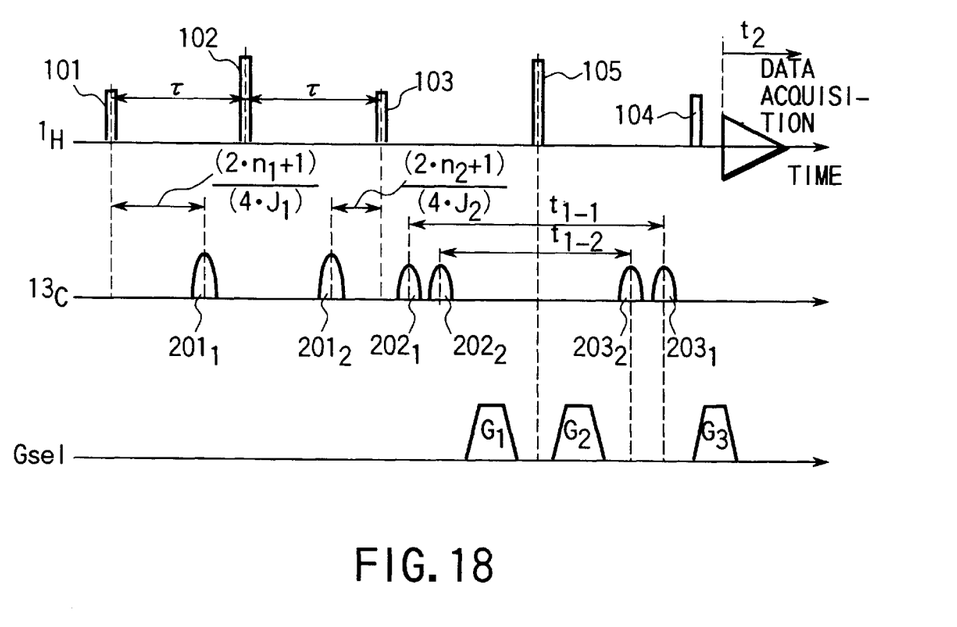
FIG. 18 is a view showing a third modified HSQC sequence in the present embodiment.

Even for the case of the HSQC, it may be possible to apply two excitation pulses $202_1$, $202_2$ of different frequency bands to the $^{13}$C as shown in FIG. 18. In accordance with this, two return pulses $203_1$, $203_2$ are applied. The return pulse $203_1$ is located symmetrically relative to the excitation pulse $202_1$ with a refocusing pulse 105 therebetween. The stand pulse $203_1$ is set to be equal in frequency band to the excitation pulse $202_1$. The stand pulse $203_2$ is located symmetrically relative to the excitation pulse $202_2$ with the refocusing pulse 105 therebetween. The stand pulse $203_2$ is set to be equal in frequency band to the excitation pulse $202_2$.

Figure 19:
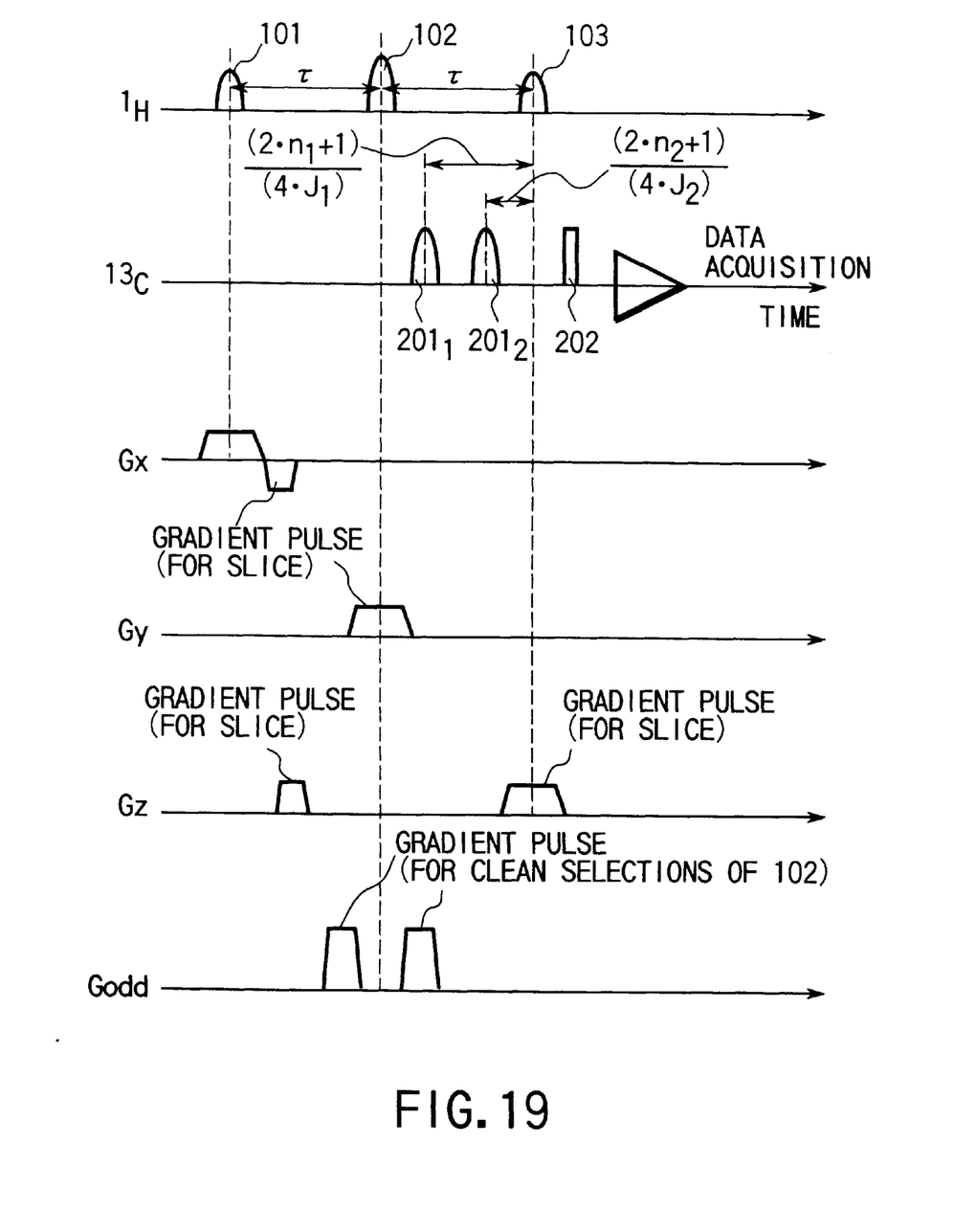
FIG. 19 is a view showing a fourth modified HSQC sequence in the present embodiment.
Figure 20:
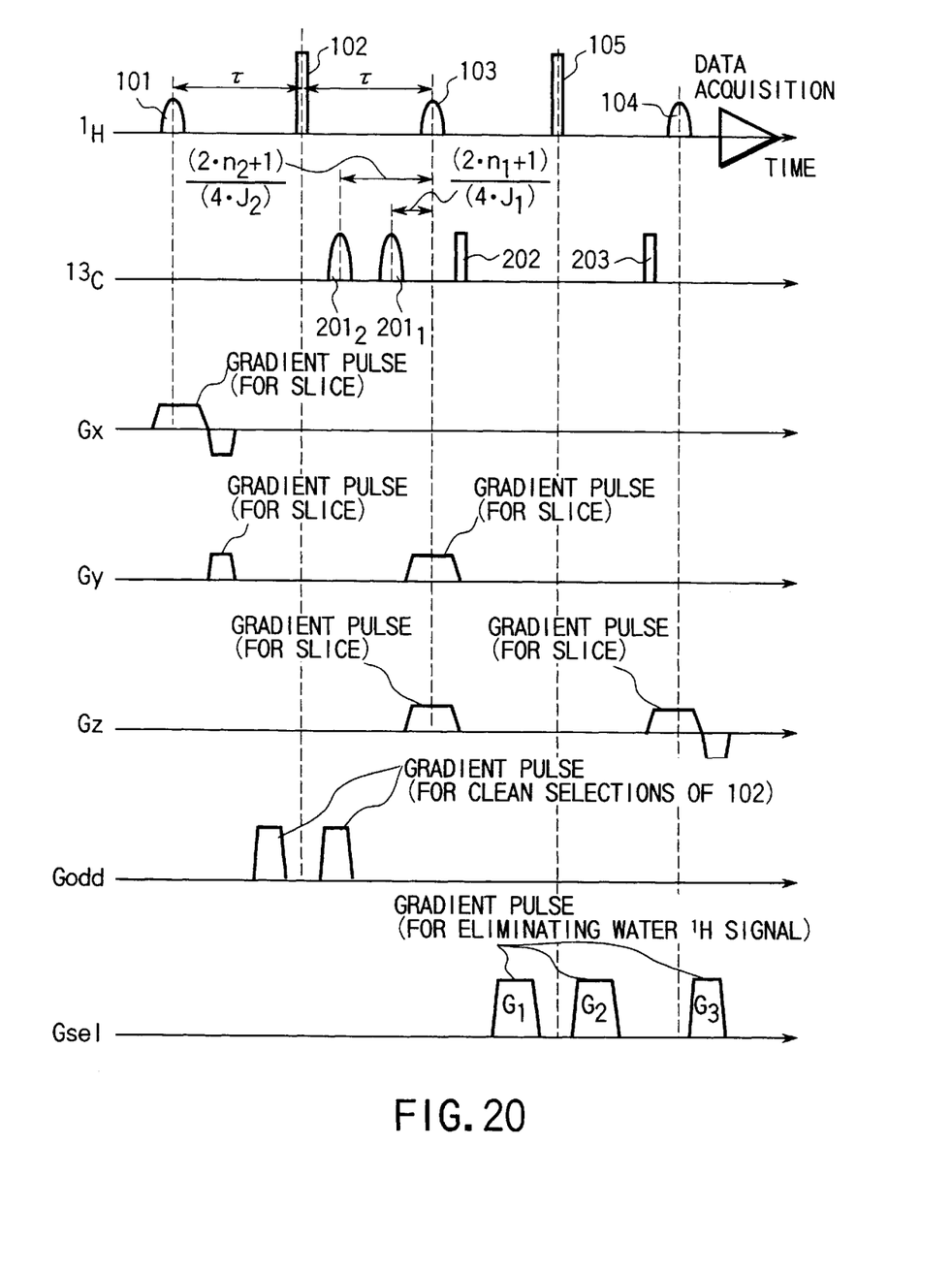
FIG. 20 is a view showing a fifth modified HSQC sequence in the present embodiment.

In the modified INEPT, by applying RF pulses 101, 102, 103 as slice selective pulses to the $^1$H together with gradient pulses as shown in FIG. 19 it is possible to achieve the localization of a 3-dimension at max. Even in the modified HSQC, the 3-dimensional localization can be realized by applying three of the RF pulses 101, 102, 103 and 104 (FIG. 16), as slice selective pulses, together with the gradient pulse. FIG. 20 shows the case where use is made of the RF pulse of a 90° flip angle which is better in slice selective characteristic than a 180° pulse.

Although the two kinds of materials, for example, the glucose α C-1, glucose β C-1 and glutamate, have been explained in connection with the present embodiment, use can be made of a $^{13}$C pulse for allowing a selective resonance to be achieved for more materials involved. By such $^{13}$C pulse it is possible to make a simultaneous observation for, for example, three, four or more materials.

The present invention is not restricted to the above-mentioned embodiment and various changes or modifications of the present invention can be made without departing from the spirit and scope of the present invention.

Additional advantages and modifications will readily occurs to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetic resonance apparatus comprising:

means for applying an excitation pulse and refocusing pulse to spins of a first nuclide and for applying a return pulse to the spins of the first nuclide at an echo time of the spins of the first nuclide;

means for applying a plurality of inversion pulses having different frequency bands from each other to spins of a second nuclide spin-spin coupled to the first nuclide at an interval between the excitation pulse and the return pulse so as to produce a polarization transfer from the spins of the first nuclide to the spins of the second nuclide and for applying an excitation pulse to the spins of the second nuclide simultaneously with or after the return pulse; and means for, after the excitation pulse applied to the spins of the second nuclide, receiving from the spins of the second nuclide a magnetic resonance signal enhanced by the polarization transfer.

2. A magnetic resonance apparatus according to claim 1, wherein the inversion pulses have effective frequency bands separated from each other, the effective frequency bands effectively inverting the spins of the second nuclide.

3. A magnetic resonance apparatus according to claim 1, wherein the inversion pulses are applied at different times.

4. A magnetic resonance apparatus according to claim 3, wherein the inversion pulses are applied to the spins of the first nuclide at $(2 \cdot n+1)/(4 \cdot J)$ before the return pulse where J: a spin-spin coupling constant between the first nuclide and the second nuclide; and n: zero or a positive integer.

5. A magnetic resonance apparatus according to claim 3, wherein the inversion pulses are applied at $(2 \cdot n+1)/(4 \cdot J)$ after the excitation pulse to the spins of the first nuclide, where J: a spin-spin coupling constant between the first nuclide and the second nuclide; and n: zero or a positive integer.

6. A magnetic resonance apparatus according to claim 3, wherein the inversion pulses are such that at least one inversion pulse is applied to the spins of the first nuclide at $(2 \cdot n+1)/(4 \cdot J)$ before the stand pulse and at least one remaining inversion pulse is applied at $(2 \cdot n+1)/(4 \cdot J)$ after the excitation pulse to the spins of the first nuclide, where J: a spin-spin coupling constant between the first nuclide and the second nuclide; and n: zero or a positive integer.

7. A magnetic resonance apparatus according to claim 1, wherein, near the excitation pulse to the spins of the second nuclide, at least one excitation pulse is applied to the spins of the second nuclide, the excitation pulses having different frequency band from each other.

8. A magnetic resonance apparatus according to claim 1, further comprising means for, in order to obtain a slice selective pulse from at least one of the excitation pulse to the spins of the first nuclide, refocusing pulse to the spins of the first nuclide and stand pulse to the spins of the first nuclide, applying a gradient pulse together with the excitation pulse, refocusing pulse and return pulse to the spins of the first nuclide.

9. A magnetic resonance apparatus comprising:

means for applying a first excitation pulse and first refocusing pulse to spins of a first nuclide, for applying a return pulse to spins of the first nuclide;

means for applying a plurality of inversion pulses having different frequency bands from each other to spins of a second nuclide spin-spin coupled to the first nuclide at an interval between the first excitation pulse and the return pulse to produce a polarization transfer from the spins of the first nuclide to the spins of the second nuclide, for applying an excitation pulse to the spins of the second nuclide simultaneously with or after the return pulse, and for applying a return pulse to the spins of the second nuclide after an evolution period during which single quantum coherence of the spins of the second nuclide is evaluated;

means for applying a second excitation pulse to the spins of the first nuclide after the evolution period simultaneously with or after the application of the return pulse to the spins of the second nuclide; and;

means for, after the second excitation pulse to the spins of the first nuclide, receiving a magnetic resonance signal containing information on the spins of the second nuclide from the spins of the first nuclide.

10. A magnetic resonance apparatus according to claim 9, wherein the inversion pulses have effective frequency bands separated from each other, the effective frequency bands effectively inverting the spins of the second nuclide.

11. A magnetic resonance apparatus according to claim 10, wherein the inversion pulses are applied at different times.

12. A magnetic resonance apparatus according to claim 11, wherein the inversion pulses are applied to the spins of the first nuclide at a time $(2 \cdot n+1)/(4 \cdot J)$ before the return pulse where J: a spin-spin coupling constant between the first nuclide and the second nuclide; and n: zero or a positive integer.

13. A magnetic resonance apparatus according to claim 11, wherein the inversion pulses are applied at a time $(2 \cdot n+1)/(4 \cdot J)$ after the first excitation pulse to the spins of the first nuclide, where J: a spin-spin coupling constant between the first nuclide and the second nuclide; and n: zero or a positive integer.

14. A magnetic resonance apparatus according to claim 1, wherein the inversion pulses are such that at least one inversion pulse is applied to the spins of the first nuclide at $(2 \cdot n+1)/(4 \cdot J)$ before the return pulse and at least one remaining inversion pulse is applied at $(2 \cdot n+1)/(4 \cdot J)$ after the first excitation pulse to the spins of the first nuclide, where J: a spin-spin coupling constant between the first nuclide and the second nuclide; and n: zero or a positive integer.

15. A magnetic resonance apparatus according to claim 9, wherein, near the excitation pulse to the spins of the second nuclide, at least one excitation pulse is applied to the spins of the second nuclide, the excitation pulses being different in frequency band from each other.

16. A magnetic resonance apparatus according to claim 9, wherein, at an interval between the excitation pulse to the spins of the second nuclide and the return pulse to the spins of the second nuclide, a second refocusing pulse is applied to the spins of the first nuclide so as to refocus a J evolution caused by the spin-spin coupling between the first nuclide and the second nuclide.

17. A magnetic resonance apparatus according to claim 16, further comprising means for applying a gradient pulse at an interval between the excitation pulse to the spins of the second nuclide and the second refocusing pulse to the spins of the first nuclide, at an interval between the second refocusing pulse to the spins of the first nuclide and the return pulse to the spins of the second nuclide, and at an interval after the second excitation pulse to the spins of the first nuclide and before detection of the magnetic resonance signal and for suppressing a $H_2O$ signal by a transfer selection.

18. A magnetic resonance apparatus according to claim 9, further comprising means for, in order to obtain a slice selective pulse from at least one of the first excitation pulse to the spins of the first nuclide, refocus pulse to the spins of the first nuclide, the return pulse to the spins of the first nuclide and second excitation pulse to the spins of the first nuclide, applying a gradient pulse together with at least one of the first excitation pulse to the spins of the first nuclide, the refocus pulse to the spins of the first nuclide, the return pulse to the spins of the first nuclide and second excitation pulse to the first nuclide.

19. A magnetic resonance apparatus according to claim 16, further comprising means for, in order to obtain a slice selective pulse from at least one of the first excitation pulse to the spins of the first nuclide, the first refocus pulse to the spins of the first nuclide, the return pulse to the spins of the first nuclide and second excitation pulse to the spins of the first nuclide, applying a gradient pulse together with at least one of the first excitation pulse to the spins of the first nuclide, the first refocus pulse to the spins of the first nuclide, the return pulse to the spins of the first nuclide and second excitation pulse to the first nuclide.

* * * * *